United States Patent

Harrah et al.

[11] Patent Number: 5,265,792
[45] Date of Patent: Nov. 30, 1993

[54] LIGHT SOURCE AND TECHNIQUE FOR MOUNTING LIGHT EMITTING DIODES

[75] Inventors: Shane Harrah, Menlo Park; Trevor J. Smith, Nevada City; John Uebbing, Palo Alto; Thomas Fajardo, Santa Clara; Jerry D. Kreger, Cupertino, all of Calif.

[73] Assignee: Hewlett-Packard Company, Palo Alto, Calif.

[21] Appl. No.: 932,754

[22] Filed: Aug. 20, 1992

[51] Int. Cl.$^5$ .......................................... H01L 21/50
[52] U.S. Cl. .................................... 228/6.2; 156/566; 221/211; 29/743; 29/759
[58] Field of Search ............ 228/179, 180.2, 102, 228/212, 62, 44.7; 29/740, 743, 759, 854; 156/566; 221/210, 211

[56] References Cited

U.S. PATENT DOCUMENTS

| | | | |
|---|---|---|---|
| 4,372,802 | 2/1983 | Harigane et al. | 29/740 |
| 4,850,780 | 7/1989 | Safabakhsh et al. | 29/743 |
| 5,084,962 | 2/1992 | Takahashi et al. | 29/740 |

OTHER PUBLICATIONS

Tatsuhiko Niina, "Advances in Liquid-Phase Epitaxy Solve Gap LED Production Problems", *Journal of Electronic Engineering*, Jul. 1975 No. 104, pp. 12-15.

*Primary Examiner*—Samuel M. Heinrich

[57] ABSTRACT

A light emitting diode has both end faces metallized and is mounted on a substrate with the light emitting junction perpendicular to the substrate. The electrically conductive ends are electrically bonded to conductive areas on the substrate by solder or conductive adhesive LED dice can be placed on the substrate by temporarily attaching the dice to a tape which has been wrapped around a knife edge. The dice tilt as the tape wraps around the edge and are picked off one at a time by a vacuum collet while temporarily supported by a movable finger, and then transferred by the vacuum collet to a substrate. A similar method may be used for placing semiconductor dice on a substrate without the tilting of dice around the edge. In another embodiment, an array of LEDs can be assembled in windows through a metallized plastic tape which is bonded to a foundation with additional metallized leads.

20 Claims, 9 Drawing Sheets

LIGHT SOURCE AND TECHNIQUE FOR MOUNTING LIGHT EMITTING DIODES

BACKGROUND OF THE INVENTION

This invention relates to a novel light emitting diode (LED) and techniques for mounting such an LED on a substrate. A method for manipulating the LEDs is also provided.

Light emitting diodes have become extremely popular with many millions of them manufactured annually. There is a continuing effort to make smaller LEDs since the smaller they can be made, the larger the number of LEDs produced from a semiconductor wafer. This can effect an appreciable cost reduction. A principal limiting factor in reducing the size of LEDs has become the electrical connections.

Typically, an LED is mounted with one electrode on a conductive substrate such as a printed circuit board, a wire leadframe or the like, with the light emitting junction parallel to the substrate. A very small wire is then "wire bonded" or welded to a small metallized area on the top face of the LED. The metallized area needs to cover less than the entire top surface so that light can be radiated from the LED. About the smallest dimensions suitable are 250 micrometer cubes.

Tape automated bonding is sometimes used to replace wire bonding since techniques have been developed for simultaneously bonding many different bond pads, instead of one at a time as with conventional wire bonding. Gang tape automated bonding, however, requires excellent coplanarity of all of the bond pads and is inappropriate for bonding a matrix of LEDs simultaneously. Furthermore, the smallest LEDs suitable for tape automated bonding are about 200 micrometer cubes. The equipment for either tape automated bonding or wire bonding is quite costly.

What is needed is a totally different approach to mounting an LED, making electrical contact with an LED, methods for handling such LEDs, and substrates for receiving such LEDs.

SUMMARY OF THE INVENTION

There is therefore provided in practice of this invention according to a presently preferred embodiment, a substrate with a light emitting diode mounted on the substrate so that the light emitting junction of the LED is perpendicular to the substrate. An electrically conductive layer is provided at each end of the LED perpendicular to the substrate and electrical contact is made to those conductive layers. If desired, electrically conductive material may be applied to the end layers before mounting, and melted for making electrical contact with the substrate. Light is emitted through the side rather than the end of the LED. The electrically conductive layer may cover all or only a part of an end of an LED.

Individual LED dice may be placed on a substrate by first temporarily attaching them to adhesive on a flexible tape. The tape is passed around an edge which bends the tape and successively tilts each die relative to a successive die in a column of dice on the tape. A side face of the tilted die is engaged by a vacuum collet which removes the LED from the adhesive and advances it towards the substrate where it is to be mounted.

Where a number of LEDs are going to be used in an array such as for an alphanumeric display, the LEDs can be mounted in windows through a nonconductive layer to make electrical contact with two conductive areas, one formed under the layer and the other on an underlying foundation.

BRIEF DESCRIPTION OF THE DRAWINGS

These and other features and advantages of this invention will be appreciated as the same becomes better understood by reference to the following detailed description when considered in connection with the accompanying drawings wherein.

DETAILED DESCRIPTION

Figure 1:
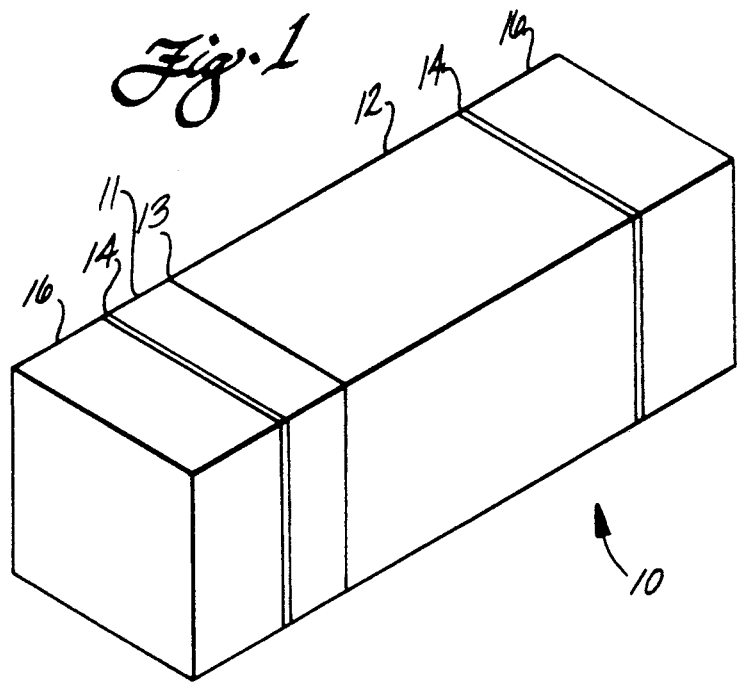
FIG. 1 is a perspective view of an exemplary LED with an optional layer of conductive adhesive.

A light emitting diode (LED) in its simplest form has a layer 11 of p-type semiconductor adjacent a layer 12 of n-type semiconductor. When current is passed through the diode, light is emitted from the junction 13 between the layers. In practice of this invention the LED is made of a semiconductor material that is transparent to the light emitted (e.g., gallium phosphide is which is transparent to green radiation). A metallized layer 14 is deposited on each end of the LED to provide electrical contact with the electrodes of the diode. The metallized layer is preferably wettable by solder and is not dissolved by solder. Nickel with a flash of gold provides a suitable end layer. The various layers in the drawings are not necessarily drawn to scale.

In the embodiment illustrated in FIG. 1, there is an additional feature which is optional. A layer 16 of heat flowable electrically conductive material is temporarily applied to each end of the LED for making electrical contact to the metal layer. An exemplary material may be a low melting point solder. Upon heating the solder melts and secures the LED onto a substrate as well as making electrical contact. Another suitable material may be silver filled epoxy resin which is partially cured. The resin flows upon heating and cures to a solid conductor which provides secure mounting and electrical contact. This added layer of conductive material is not required and contacts may be provided later as hereinafter described.

Such an LED is made by conventional semiconductor processing where the layers are formed on a thin crystalline wafer of semiconductor material. Such a wafer may have either n-type or p-type starting material and the opposite type of material is deposited thereon by conventional techniques such as liquid phase epitaxial growth or chemical vapor deposition. An exemplary LED has a 200+ micrometer thick substrate of n-type material and a 40 micrometer thick layer of deposited p-type material. The semiconductor wafer is then metallized on both faces and if an optional conductive layer is used, that is added to the wafer. The wafer is then sawed to create separate LED dice as illustrated in FIG. 1.

The light emitting p-n junction plane is parallel to the two metallized ends of the die. The light emitting junction between the p-type and n-type materials of the LED typically has the anode closer to the metallized end than the cathode since depositing the second layer on the substrate is relatively costly. Alternatively, the junction may be in the center of the die to be as far from both ends as possible to reduce the possibility of short circuits if a conductive die attach material flows underneath the LED.

In an exemplary embodiment such an LED die has a length (including the metal layers but not including the optional conductive layers 16) of 250 micrometers. The width of the LED is only 125 micrometers square. Such LEDs are sawed from a wafer 250 micrometers thick. Such an LED has a width parallel to the junction less than the height perpendicular to the junction. Because of the mounting arrangement, this is desirable to minimize the likelihood of shorting between the electrodes and reduce cost.

Instead of mounting the LED on a substrate with the junction parallel to the substrate, the new LED die is mounted on a substrate 17 (FIGS. 2 and 3) so that the junction 13 is perpendicular to the substrate. In this embodiment of an LED lamp, the substrate is a small piece of printed circuit board 1.6 millimeters long, 0.8 millimeters wide and about 0.3 millimeters thick.

At each end of the substrate there is a semicylindrical recess 18 between the top and bottom faces of the substrate. The substrate is plated with metal so as to have a layer including an area 19 on the top face, an area 21 on the bottom face and an interconnecting area 22 in the recess. Similar electrically conductive areas are provided at each end of the substrate for making electrical contacts between the LED and associated circuits. The external electrical connections are made by "surface mounting" the substrate in a conventional manner.

Such a lamp substrate is made by conventional processing techniques where a relatively large printed circuit board is constructed and plated (electrolessly and/or electrolytically) in the desired areas on the top and bottom faces and through holes drilled through the printed circuit board.

A thin layer of photo-imagable solder mask 23 is applied as electrical insulation over the entire top surface of the printed circuit board and small areas are removed adjacent the ends of the LEDs, leaving the underlying metal areas 19 exposed through the holes in the solder mask. A tiny drop of adhesive (not shown) is applied to the printed circuit board over the solder mask between the open holes. When the center of the LED is placed on the drop of adhesive, it sticks in place for handling until secured to the substrate by electrically conductive solder 25 or polymer. The LED is placed so that its metallized ends are adjacent to the holes through the solder mask. The metallized ends are then soldered to the respective metallized areas 19 on the top face of the substrate. Soldering of the LEDs on the substrate can be by simply dipping into molten solder or by wave soldering.

Alternatively, the LED may be soldered to the substrate by placing a small bead of solder paste on each of the exposed metal areas and temporarily adhering the LED to the substrate by way of the paste. Heating melts the solder paste and secures the LED to the substrate. In another analogous embodiment, the LED can be adhered to the metal areas temporarily by metal filled epoxy or other polymer which is melted and cured by heating for a permanent bond and electrical connection.

The final step is to encapsulate the LED on the top face with a transparent plastic body 24. Such manufacturing operations are concluded on a relatively large printed circuit board which is then sawed into the individual LED lamps leaving half of the plated-through holes at the ends of adjacent pieces as illustrated in FIGS. 2 and 3.

Alternatively, the ends of a substrate may be flat and coated with metal to provide electrical contact to the lower face of the substrate. The choice of flat ends versus those with semi-cylindrical recesses is a matter of which costs less.

Figure 2:
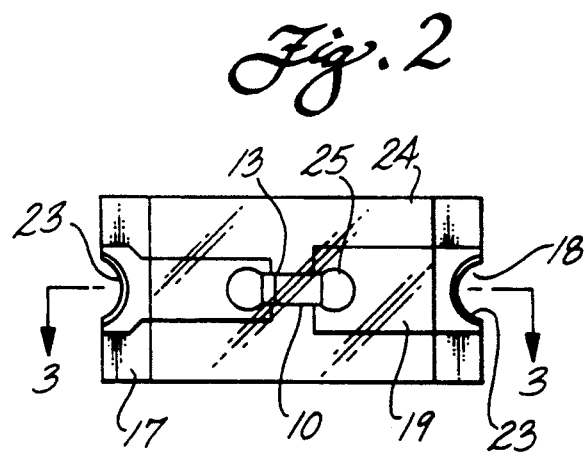
FIG. 2 is a top view of such an LED mounted in a lamp.
Figure 3:
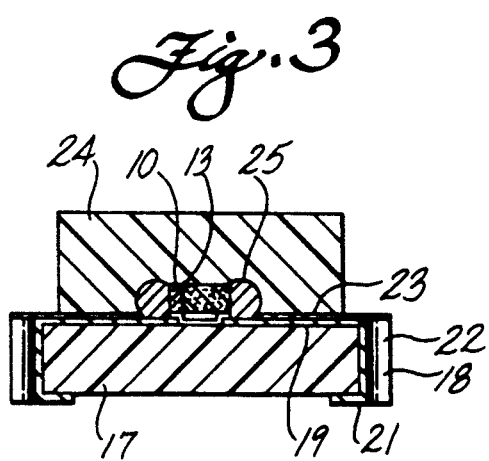
FIG. 3 is a longitudinal cross section through the mounting arrangement illustrated in FIG. 2.

The transparent body potting the LED is illustrated rectangular in FIGS. 2 and 3, however it will be apparent that it might have a curved exterior to serve as a lens. The shape of the encapsulation body may be varied to provide other functions. For example, in embodiments described hereinafter, the metallized area may occupy less than the entire end of the LED so that some of the light is emitted through the end. A semicylindrical or semispherical end may then be used on the encapsulating body to act as a lens for directing light laterally from the lamp.

Similarly reflectors such as an egg crate reflector may be provided adjacent to the LED for directing light in a selected direction. Furthermore, it will be apparent that more than one LED may be mounted in such a lamp. These LEDs may have separate electrical connections or if desired two LEDs can be mounted on only one pair of electrical connections and either one can be used to emit light by controlling the direction of current through the lamp. Thus, multiple colored LED lamps can be made using this technique.

As one might guess from the minute dimensions on the LED dice, special handling equipment is important for manipulating them and placing them in the correct position on the substrate. A fragment of such apparatus adjacent to the LEDs themselves is illustrated in a somewhat schematic side view in FIG. 4. There are a number of movable components in this apparatus and the various solenoid cylinders and the like employed for operating the apparatus are omitted since they are not required for an understanding of the method of manipulating the LED dice.

Before describing the method and apparatus there should be an understanding of how the LED dice are made and arranged for use in the apparatus. As mentioned above, the LEDs are made by growing a large wafer with the light emitting junction parallel to the faces of the wafer. The faces of the wafer are metallized. The wafer is placed on adhesive tape which can be stretched bidirectionally. Narrow slits are sawed through the wafer in orthogonal directions to separate adjacent LEDs from each other. The tape is then bidirectionally stretched for increasing the space between adjacent LEDs. In a typical embodiment the LEDs which are about 125 micrometers square in plan view are spaced apart about 75 micrometers after the tape is stretched. This technique for handling semiconductor devices on adhesive tape is conventional so is not illustrated herein.

Figure 5:
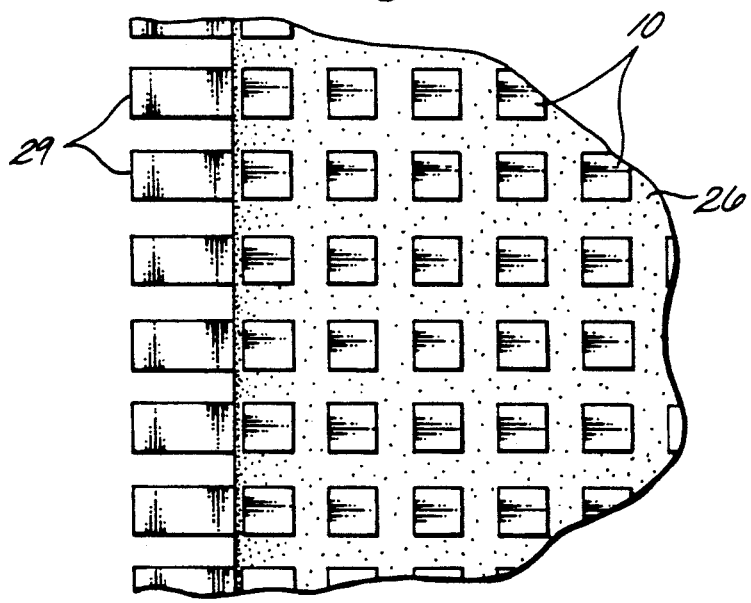
FIG. 5 illustrates a plurality of LEDs mounted on a tape for use in the apparatus of FIG. 4.

After the sawing and stretching the tape, the separated LEDs 10 are transferred to a second adhesive tape 26 as illustrated in FIG. 5. This is done by bringing the second tape into contact with the ends of the LED dice while still mounted on the original tape. The adhesive on the second tape is more aggressive than the adhesive on the first tape so that when the tapes are separated, the LEDs adhere preferentially to the second tape. A second tape is used so that it is not stretchable during handling of the LEDs. Suitable tape comprises 25 micrometers thick polyethylene terephthalate with a layer of adhesive up to about 50 micrometers thick. Suitable tapes are commercially available for handling semiconductor devices.

Equipment is already available to take semiconductor devices off of such a tape and set them onto substrates in desired locations. That equipment, however, picks up a device which has a junction parallel to the tape and sets it on a substrate with the junction parallel to the substrate. What is needed for the described LED is equipment that rotates the LED so that the junction is perpendicular to the substrate. It is preferable to do this in a single operation rather than hand the LED from one device to another as it is rotated. The apparatus illustrated in FIG. 4 can place the LED on a substrate with the junction perpendicular to the substrate in a single operation.

The tape 26 with LEDs attached is wrapped around the edge of a horizontal "knife" 28 and sufficient tension is applied to the tape that it conforms closely to the edge of the knife. The knife is positioned a short distance above a substrate 17 with one face essentially parallel to the substrate. The other face diverges at an angle of 5° from the edge. In an exemplary embodiment, the edge of the knife has a thickness of 125 micrometers and there is a radius of 50 micrometers between the edge and each face. Such dimensions are suitable for a tape with a thickness and LEDs with dimensions as outlined above. Other dimensions may be suitable for other LEDs, etc. Preferably, the tape is bent through an angle of at least 150° to provide adequate rotation of the LEDs and clearance from an underlying substrate.

Figure 4:
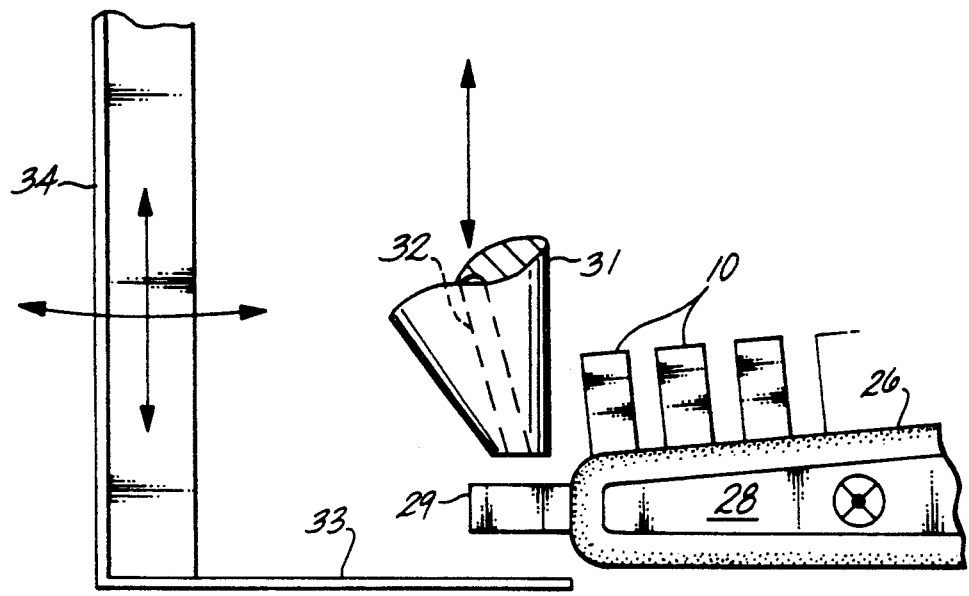
FIG. 4 illustrates semi-schematically a fragment of apparatus for mounting individual LEDs.

The tape is advanced around the knife edge until a row of LEDs reaches the edge and rotates around the edge as illustrated by the LED dice 29 in FIGS. 4 and 5. The separation of the LEDs on the tape and the bending of the tape around the knife edge serve to rotate the LEDs 29 approximately 90° relative to the LEDs remaining on the top face of the knife. Preferably an optical system (not shown) observes an LED in the row after rotation and provides feedback to the tape drive to advance or retract the tape as required to place the LED in the correct position. Furthermore, the knife can move in a direction parallel to the edge (i.e., in or out of the paper in the illustration of FIG. 4 as indicated by arrow point and tail symbol) for locating an LED die in the row in the correct position. The horizontal substrate 17 underneath the knife is also movable in X and Y directions so that the correct location for receiving an LED is positioned directly beneath an LED on the tape.

A vacuum collet 31 is positioned for vertical motion just beyond the tape as it wraps around the edge of the knife. The end of the vacuum collet is horizontal and has a width about the same as the length of one of the LED dice. A vacuum passage 32 extends through the collet.

An LED support finger 33 is mounted in a position where it can move horizontally to bring the end of the finger underneath an LED on the edge of the knife. The finger is mounted on an arm 34 which can move vertically as well as swing a small distance horizontally.

The method of operating of the apparatus can be understood by reference to FIG. 6. Once an LED die has been positioned by moving the tape and knife edge so that the die is substantially horizontal and directly underneath the vacuum collet, the collet is moved downwardly toward the die as illustrated in FIG. 6a until it is in contact with the die as illustrated in FIG. 6b. Meanwhile the support finger is moved horizontally to a position immediately beneath the horizontal die. The finger may simultaneously move somewhat upwardly to close the distance between the die and finger.

Figure 6A:
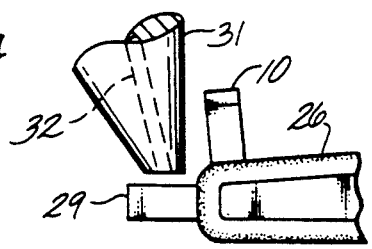
FIGS. 6a–6e illustrate schematically a sequence of steps during removal of an LED from the tape.
Figure 6B:
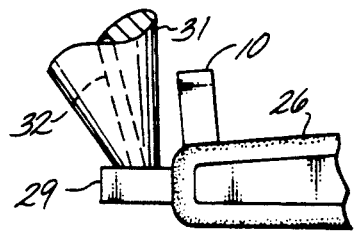
Figure 6C:
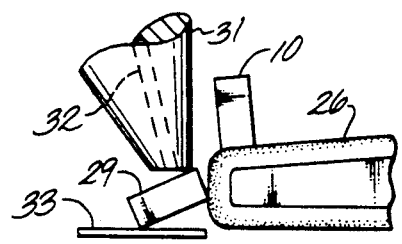
Figure 6D:
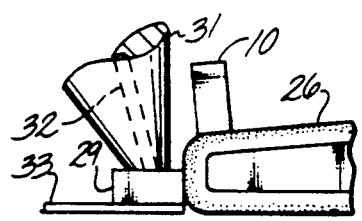
Figure 6E:
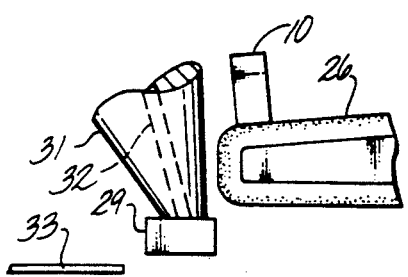

When the finger is in position, the collet moves downwardly, tending to rotate the die away from the tape and toward the finger as illustrated in FIG. 6c. When the LED die is stripped from the adhesive on the tape, it is essentially captive between the support finger and vacuum collet as illustrated in FIG. 6d. A vacuum drawn through the vacuum passage of the collet supports the LED die. The finger provides temporary support to minimize rotation of the die and assure engagement by the vacuum collet. Finally the finger is moved downwardly from beneath the die while the collet is stationary and laterally out from under the die as illustrated in FIG. 6e.

The collet can then move downwardly for transferring the LED die to the substrate. When the LED die is against the substrate vacuum is relieved and a slight air pressure is applied in the vacuum passage for assuring that the die is ejected and remains on the substrate. The collet is then moved upwardly to be clear of the LEDs on the knife edge for repeating the cycle.

The cycle moves one LED die at a time from the tape wrapped around the knife edge to the substrate. The substrate is translated underneath the vacuum collet to position the substrate (e.g., a printed circuit board) in the proper position for receiving each successive die. The dice are removed from the tape one at a time along a row across the length of the knife edge. When one row is completely removed, the tape is indexed forwardly a sufficient distance (e.g., about 400 micrometers) to bring the next row of dice around the knife edge to an approximately horizontal position for further repetitions of the cycle.

Such apparatus for placing dice on a substrate is quite rapid, placing approximately two dice per second.

After placing on the substrate the LED die is secured in place by a low melting point solder or electrically conductive adhesive interconnecting the metallized layers at each end of the LED to conductive areas on the substrate.

Figure 7:
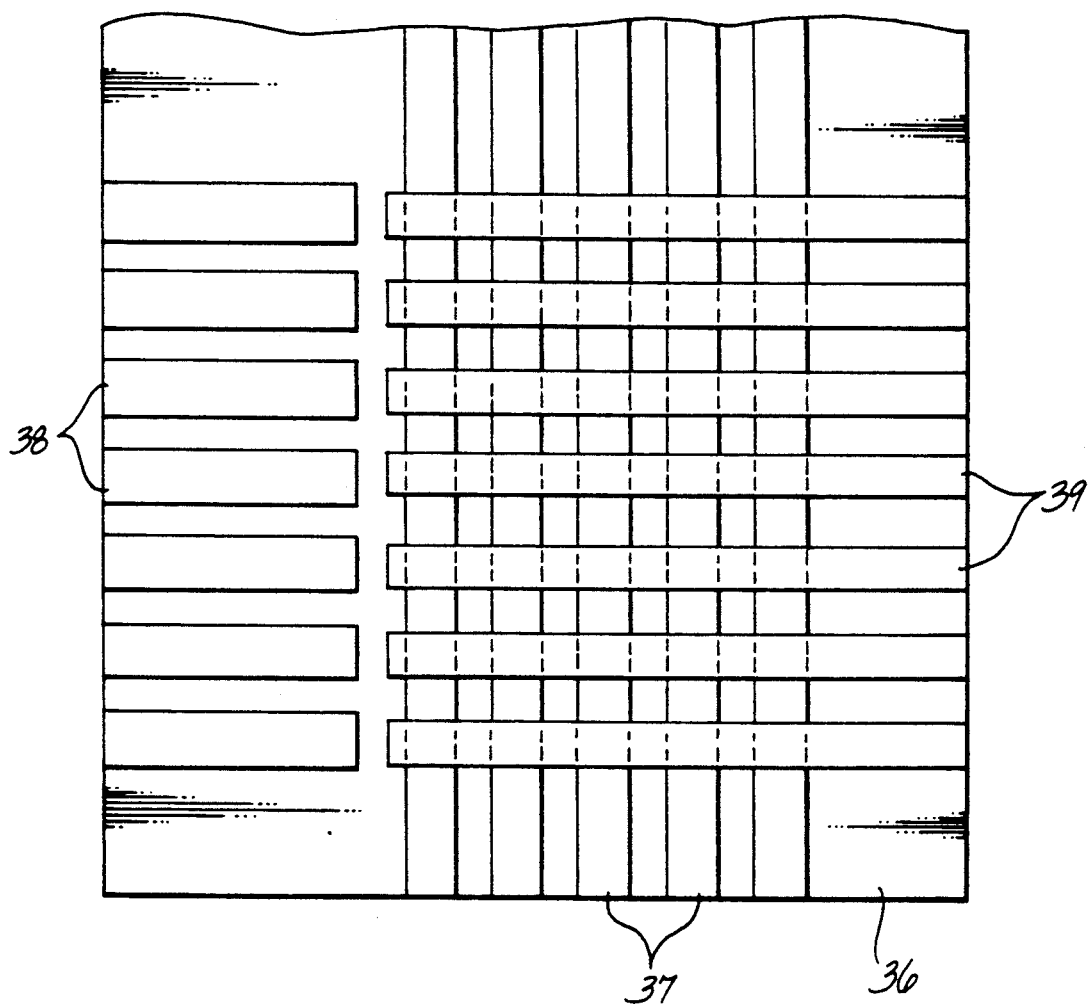
FIG. 7 illustrates a foundation with electrically conductive areas for receiving LEDs in an array.

A common usage for LEDs is in a 5 by 7 array for displaying alphanumeric characters. LED dice with the light emitting junction perpendicular to the substrate are well suited for mounting in such an array. An exemplary arrangement for such an array is illustrated on FIGS. 7 to 10. FIG. 7 illustrates the foundation 36 for such an array, which may be a small piece of printed circuit board, a piece of glass or ceramic, or where flexibility is desired it may be a plastic film. Five parallel metal stripes 37 are deposited across the foundation. Orthogonal to the stripes there are seven metal connector pads 38. Seven solder mask strips 39 are placed over the stripes in alignment with the connector pads. The solder mask strips may be in pieces of adhesive tape or may be deposited as a photoresist which is etched away where not required.

Figure 8:
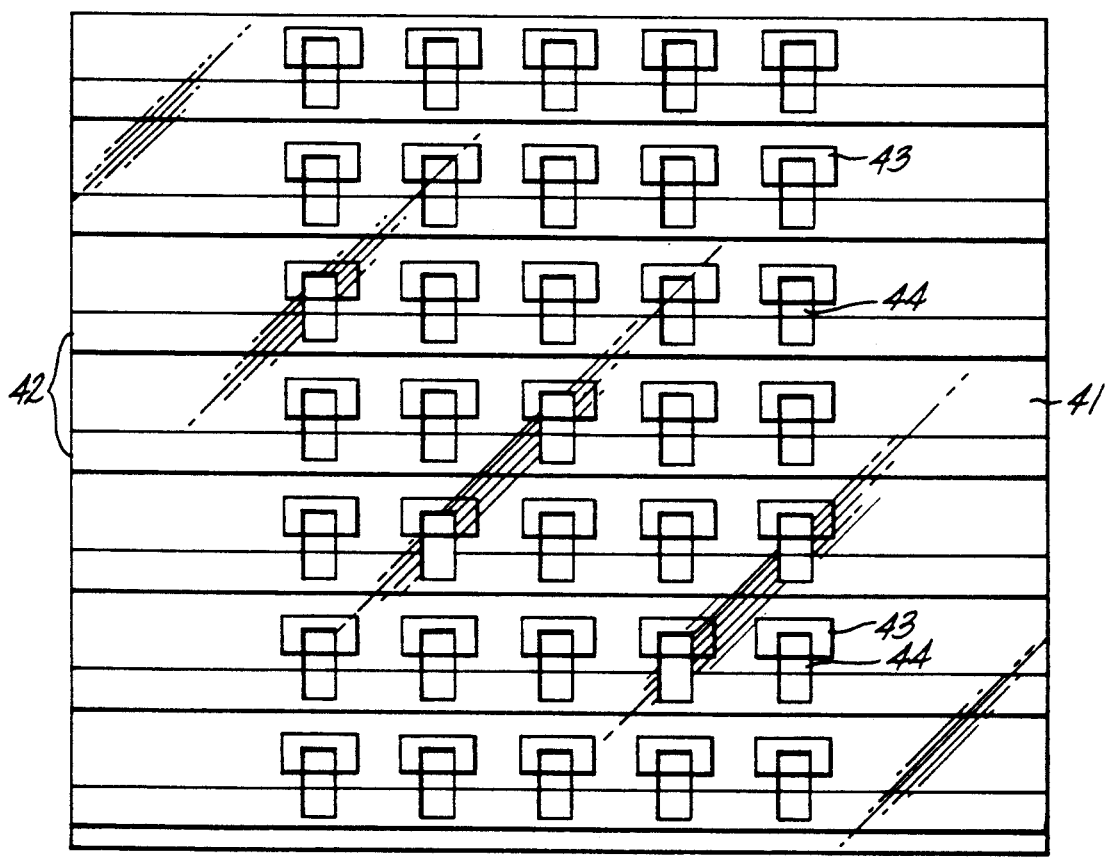
FIG. 8 illustrates a layer for positioning LEDs.
Figure 9:
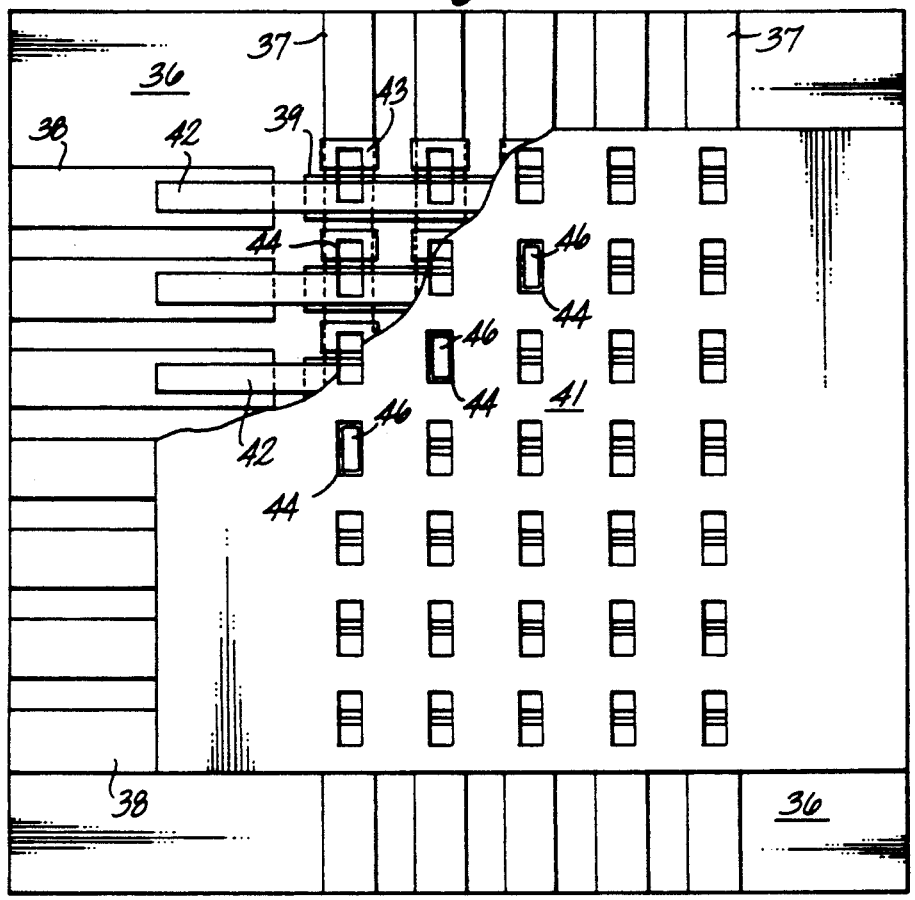
FIG. 9 illustrates the layer of FIG. 8 superimposed on the foundation of FIG. 7.
Figure 10:
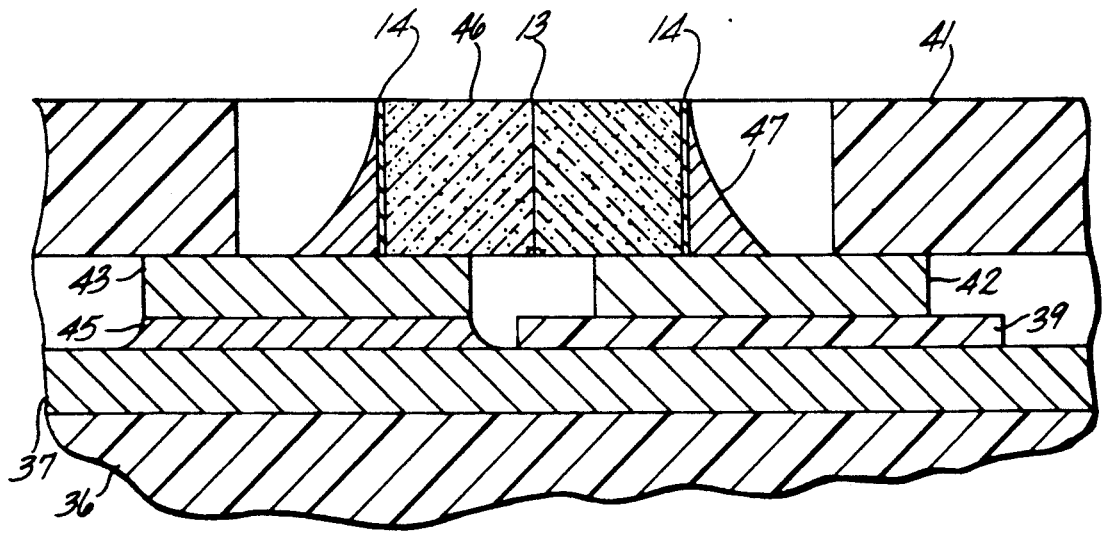
FIG. 10 is a longitudinal cross section through an exemplary LED on the foundation.

The second layer of the assembly for forming the array is illustrated separately in FIG. 8 and in position on the foundation in FIG. 9. It comprises a layer of tape 41 which is illustrated as transparent in FIG. 8 and as opaque in FIG. 9 to minimize confusion with many overlapping lines. On the underneath side of the tape there are seven metal traces 42 each extending the full width of the tape. In between the traces there are metal contact pads 43 in seven rows of five each. The tape has a 5 by 7 array of rectangular windows 44. Each window has one end overlapping a metallized trace and the other end overlying one of the contact pads 43.

The final assembly with an array of LEDs is made by superimposing a piece of tape as illustrated in FIG. 8 on the foundation as illustrated in FIG. 7 to provide an assembly as illustrated in FIG. 9. In FIG. 9 one corner of the tape (but not the metal traces or contact pads) is cut away for illustrating the underlying metal and solder mask. The tape is adhered to the foundation by nonconductive adhesive (not shown) silk screened in nonmetallized areas and with electrically conductive adhesive 45 between metallized areas to make electrical contact such as between the ends of the traces 42 on the tape and the connector pads 38 on the foundation, and between the contact pads 43 on the tape and the stripes 37 on the foundation.

The tape is placed on the foundation so that the ends of the seven metal traces 42 overlap and are in electrical contact with the connector pads on the foundation. The traces are electrically insulated from the five metal stripes 37 on the foundation because of the overlying solder mask strips 39. Each metal contact pad 43 on the underside of the tape overlies and is in electrical contact with a metal stripe 37 on the foundation. The connector pads and at least one end of the stripes extend beyond the edges of the tape for making external electrical connections to external circuits for operating the alphanumeric display.

An LED 46 is placed in each of the windows in the tape with its metallized ends overlapping a contact pad and metal trace underneath the tape, and its center portion spanning between the two metal areas under the tape. Only a portion of the LEDs are illustrated in FIG. 9, leaving some of the windows "open" to show the underlying structure. The center portion of the LED is in between the pad and trace so that there is no direct electrical contact. The metallized ends of the LED are bonded to the underlying metal pad or trace, respectively, to provide electrical contact as well as mechanical securing of the LED. Solder or electrically conductive adhesive 47 may be used. In this embodiment, the p-n junction is illustrated in the center of the LED. Alternatively, it may be closer to one end as illustrated above.

Such an array of LEDs is readily fabricated with considerable automation. The tape can have windows cut and metal pads and traces applied in long rows. Since the traces extend from edge to edge on each piece of tape they are preferably applied in the longitudinal direction of the tape. Each LED die can be placed in a window with its two metallized ends perpendicular to the two metal areas underneath the window. The junction is between the metal areas and when bonded on the tape before it is attached to the foundation, there is little likelihood of electrical shorting. Once the LED dice have been placed into the windows the tape is exposed to sufficient heat to flow the die attach material on the ends of each die. The die attach material may be an electrically conductive B-stage epoxy which flows and cures upon heating. Alternatively, a low melting solder may be used as the die attach material. Polyimide tape may be used for resisting the heating required for attaching the LED dice.

After the dice have been placed in the windows the tape is cut to an appropriate length, placed as illustrated on the foundation, and bonded in place.

If desired, the foundation may be glass with metallized stripes and pads. The coefficient of thermal expansion of glass is relatively close to the coefficient of thermal expansion of LED dice so that stresses due to thermal cycling are minimized. Furthermore, the active junctions of the LEDs are over transparent areas and the glass may be used as the window of an LED display.

An alternative to a tape and foundation arrangement as illustrated, employs a rigid or flexible substrate with two layers of metal traces to which electrical contact may be made. Instead of placing LED dice individually, dice may be placed in an array of rectangular cavities by vibration (like a pill counter). When all of the cavities are filled and excess LEDs removed, the final connection substrate is placed over the array of cavities, which is then inverted so that the LEDs contact the substrate to which they are bonded. Such cavities may be provided for repeated use in mounting equipment or may be a part of the window for a final LED display. When such a mounting technique is used there is no distinction between the anodes and cathodes of the LEDs and they are driven by alternating current instead of DC.

In an embodiment where a heat flowable conductive material is applied to the metal layers on the LED before the LED is mounted on a substrate, the material may be added to the wafer before the LED dice are separated, so long as the conductive material does not smear during sawing. If it does, the smeared material may be removed by a very gentle etching, or the conductive material may be added to the individual dice while on a tape by transfer from another tape.

FIG. illustrates another embodiment of LED suitable for mounting on a substrate with the light emitting junction perpendicular to the substrate. In this embodiment the LED has an anode material 111 nearer one end, deposited on a cathode layer 112. The anode layer is thinner than the cathode substrate and the p-n junction is therefore nearer one end of the LED. The cathode end of the LED receives a metallized layer 114 for making electrical contact.

At the anode end an electrical contact is provided by way of a metallized pad 151 which covers only a portion of the end face of the LED. For example, for an LED that is 125 micrometers square, the pad may be one-half that width or about 60 micrometers square. The pad is located adjacent to one side face of the LED so that it is next to the substrate on which the LED is mounted. The metallized layer 114 and pad 151 are soldered to the substrate for mounting the LED and providing electrical contact.

Such an embodiment has been shown to emit about 40% more light than an embodiment where the entire end face of the LED is covered by a metallized layer.

Figure 11:
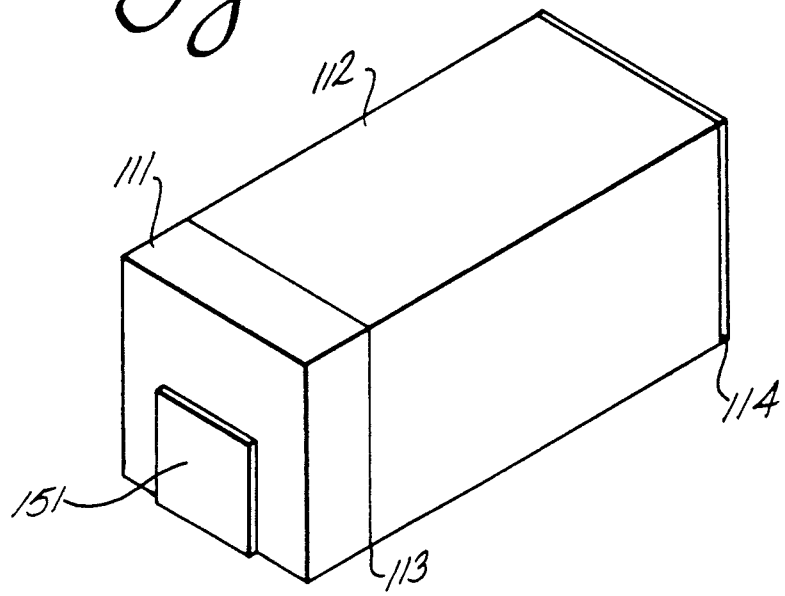
FIG. 11 is an isometric view of another embodiment of LED which provides greater light output.
Figure 12:
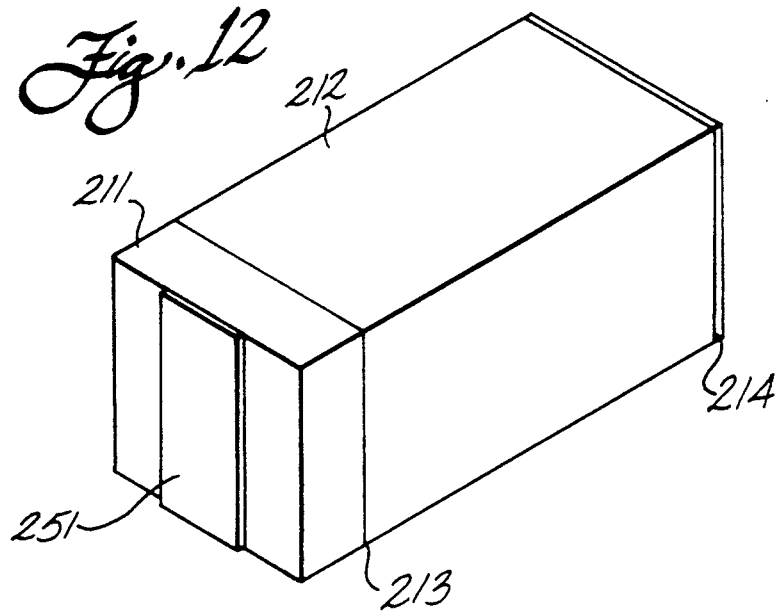
FIG. 12 is an isometric view of still another embodiment of LED.

FIG. 12 illustrates still another embodiment of LED rather similar to that illustrated in FIG. 11. The LED itself is similar, with an anode layer 211, cathode layer 212, p-n junction 213 and metallized layer 214 on the cathode end. A metallized pad 251 is provided at the anode end of the LED with a different shape than the pad illustrated in FIG. 11. In this embodiment the metallized pad extends between the opposite side faces of the LED and has a width of about 30 to 40% of the width of the end face of the LED. For example, on a 125 micrometer square LED, the pad may be a stripe 40 to 50 micrometers wide.

An embodiment as illustrated in FIG. 12 can be useful for dip or wave soldering since the wettable metal pad extends the full height of the LED above the substrate. The solder contacting the pad is therefore drawn along the pad surface to assure soldering to the substrate.

The metallized pads 151, 251 on the ends of LEDs may be deposited in a conventional manner on the wafer before it is sawed. A photoresist layer is then used for removing a portion of the metallized layer and leaving the desired pads.

Either of the two embodiments illustrated in FIGS. 11 and 12 is desirable for use in a "right angle" LED lamp. Such a lamp may be surface mounted near an edge of a printed circuit board for casting illumination parallel to the face of the printed circuit board. These are used as indicator lamps along an edge of the printed circuit board. By mounting such a lamp with the partially covered end face pointing in the direction illumination is desired, a substantial increase in light intensity may be achieved.

Such a right angle LED may have a lens structure at one end and the technique for mounting the LED with the junction perpendicular to the substrate automatically provides for appreciable light emission toward the lens without special mirrors or prisms. If desired, additional intensity may be provided by a prism or angled mirror.

It will also be noted that such an arrangement where the end face is only partially covered by a metallized pad is desirable where the original wafer material is opaque to the emitted light. The thinner deposit layer is transparent and light emitted through the end face is a substantial portion of the total light emitted from the LED. Preferably both the N and P type materials are transparent for still greater light output.

Figure 13:
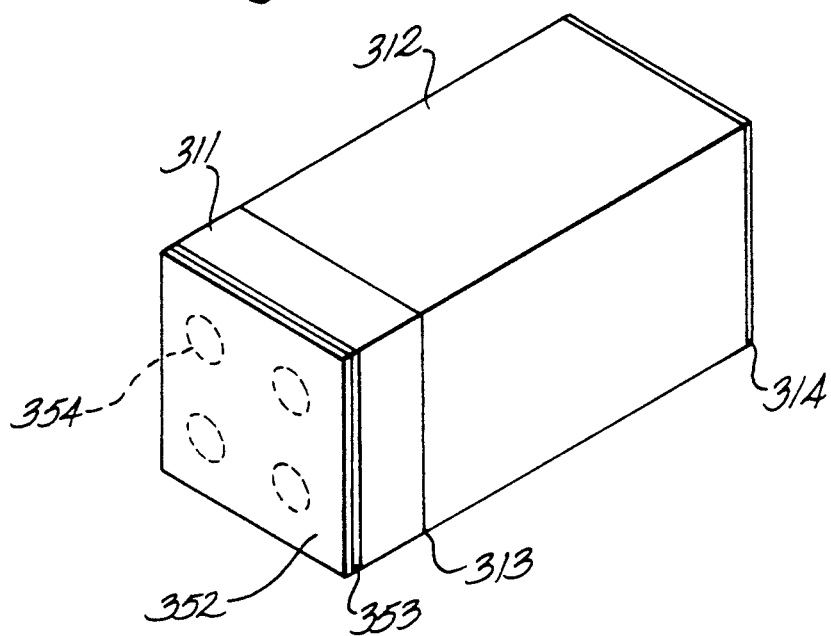
FIG. 13 is an isometric view of another embodiment of LED constructed according to principles of this invention.

FIG. 13 illustrates another embodiment where electrical contact is made to one face of the LED over less than the entire area of the end face. In this embodiment the LED has a p-type layer 311 and n-type layer 312 with a p-n junction 313 therebetween. The cathode end is coated with a metallized layer 314 as described above. Alternatively, this layer may also be made in the same manner as a metallized layer 352 at the anode end of the LED.

At the anode end there is a thin layer of silica to provide reflection. Small holes 354 are etched through the silica layer so that there is electrical contact through the holes between the anode and a metal layer 353 deposited over the silica. The ohmic contacts where there is electrical connection are essentially absorbers of emitted radiation, whereas the silica layer provides for reflection, thereby enhancing the light output of the LED as compared with one where the entire end face is metallized without the intervening layer for reflection.

Such a pattern of "polka dots" can be provided on the end of the LED without concern about location. Thus, the photoresist mask used for etching the holes through the silica can be shifted laterally or skewed relative to the LEDs without affecting the functioning. Regardless of such shifting, approximately the same contact area is provided on the end face of the die. It is of no concern that a hole overlaps an edge of the face.

Such an arrangement provides an entire metallized end face at each end of the LED for reliability in soldering the LED to the substrate. The emitted light is however enhanced, as compared with an LED without the "polka dot" pattern of electrical contacts through a reflective layer.

The minute LEDs mounted with the light emitting junction perpendicular to the substrate provide a number of advantages. As indicated above, the LEDs may be smaller, hence a larger number of LEDs are obtained per wafer and the cost is thereby lower. Such LEDs are particularly well suited for right angle LED lamps. The LED can be attached to a broad variety of substrates since they do not require wire bonding, the substrate metallization does not need a thick layer of gold suitable for wire bond adhesion. Furthermore, costly wire bonding equipment is not needed. The absence of wire bonding also improves reliability and productivity.

Figure 14:
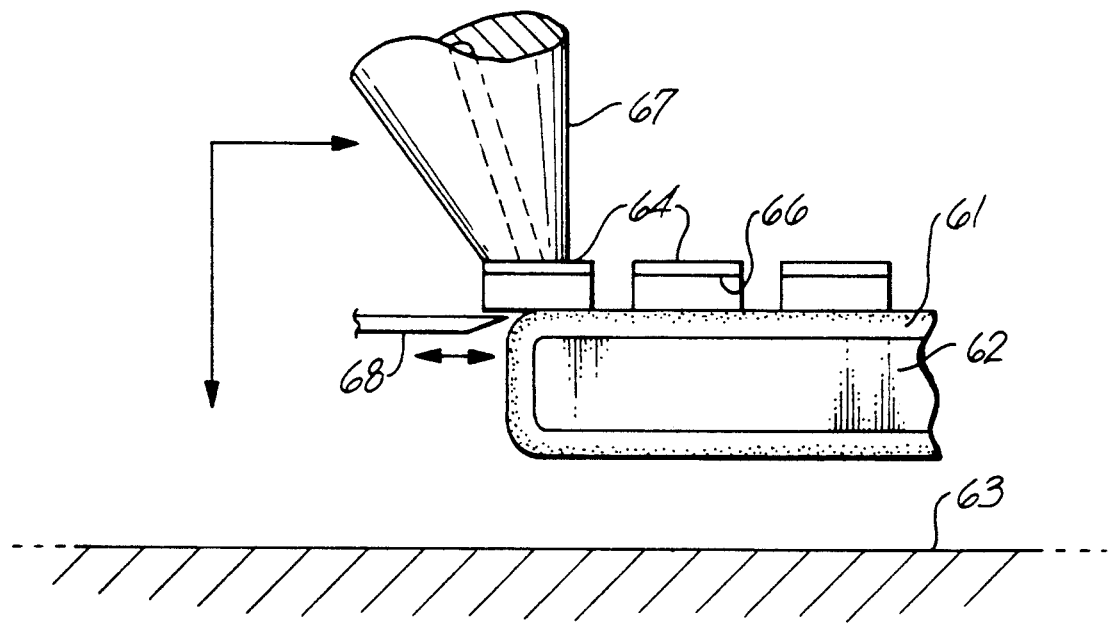
FIG. 14 illustrates semi-schematically a fragment of apparatus for mounting individual component chips, such as LEDs.

FIG. 14 illustrates semi-schematically a fragment of apparatus somewhat similar to that illustrated in FIG. 4. The illustrated apparatus is suitable for placing semiconductor dice such as LEDs on the substrate without rotating the dice relative to the substrate. Such apparatus is advantageous because of the short stroke for placing a die on the substrate after it is removed from an adhesive tape.

In conventional placement of certain types of semiconductor dice on a substrate, such as for example placing LEDs with their light emitting junctions parallel to the substrate, a vacuum collet is lowered to engage a face of the die on an adhesive tape. The vacuum collet is lifted for removing the die from the tape and traversed laterally past an edge of the tape. The vacuum collet is then lowered for placing the die on the substrate, whereupon the collet returns to pick up another die. In the conventional apparatus the tape is fed through the apparatus and the lateral travel of the vacuum collet covers a substantial distance. It is desirable to minimize the distance of travel since the traveling takes time and limits the speed at which dice can be placed on a substrate.

In the apparatus illustrated in FIG. 14 a very short stroke of the vacuum collet is used for removing the dice from the adhesive and placing them on the substrate.

In this apparatus a flexible tape 61 is wrapped around a knife edge 62, at least the lower face of which is parallel to the substrate 63 on which LED dice 64 are to be placed. In this embodiment the light emitting junction 66 of the LED is parallel to the adhesive on the tape. The LEDs are advanced as the tape is wrapped around the edge.

A vacuum collet 67 is brought into engagement with the top face of an LED as it approaches the edge where the tape bends. The vacuum applied by the vacuum collet may be sufficient for removing the die from the adhesive. If so the vacuum is collet is simply moved laterally away from the edge a sufficient distance to clear the edge and then lowered toward the substrate for placing the LED on the substrate.

It is desirable that the upper face of the knife edge be parallel to the substrate so that the vacuum collet can be simply raised or lowered and moved horizontally for removing an LED from the adhesive and placing it on the substrate. If the upper and lower faces of the knife edge diverge, as illustrated in FIG. 4, an additional small amount of rotation of the vacuum collet may be needed.

A temporary support finger 68 may also be used to help in removing the die from the adhesive on the tape. The finger is advanced horizontally into close proximity to the tape so that the face of the die adjacent to the adhesive engages the finger and the die is "peeled" from the tape as the tape bends. When the die has been securely engaged by the vacuum collet, the finger can be retracted so that the vacuum collet and die can be advanced toward the substrate. It may be desirable to lower the temporary support finger a slight amount or raise the vacuum collet to assure clearance as the support finger is retracted.

Such a temporary support finger can be desirable when the upper surface of the knife edge is not parallel to the substrate since the die may be completely removed by way of the support finger before it is securely engaged by the vacuum collet. The support finger can provide a horizontal surface to support the die and provide a horizontal top surface of the die for engagement by the vacuum collet, thereby avoiding any requirement for rotational motion of the collet.

Although described for placing an LED on a substrate it will be apparent that apparatus as described may be used for placing other types of semiconductor dice on a substrate. These may be discrete components or small integrated circuits, as well as LEDs or the like. The advantages of a short stroke between removing a die from the adhesive tape and placing it on the substrate are equally applicable.

Although limited embodiments of LEDs mounted with the light emitting junction perpendicular to a substrate have been described and illustrated herein, many modifications and variations will be apparent to those skilled in the art. For example, a die tilted on a piece of bent tape may be removed from the adhesive by frictionally engaging opposite side faces perpendicular to the substrate to hold the die as it is moved toward the substrate. Also, it may not be necessary to remove the dice from a stretchable tape to a non-stretchable tape for bending around an edge. Thus, the same tape used during sawing of the wafer may be wrapped around a knife for placing the LEDs in position to be removed.

The alphanumeric array described and illustrated is merely one of many arrangements of LEDs or other devices which may be employed. LEDs with a light emitting junction perpendicular to the substrate may be used in seven segment numeric displays, moving message panel arrays, multichip annunciators, or wire leadframe lamps, for example. The mounting arrangements for such devices may be much different from and simpler than the 5 by 7 array illustrated.

Thus, it is to be understood that within the scope of the appended claims the invention may be practiced otherwise than as specifically described.

What is claimed is:

1. A method for mounting light emitting diode dice on a substrate comprising the steps of:
   temporarily attaching the dice to adhesive on a flexible tape in a column extending along the tape;
   bending the tape for successively tilting each die relative to a successive die in the column;
   removing a tilted die from the adhesive; and
   advancing the removed die toward the substrate.

2. A method as recited in claim 1 comprising engaging at last one side face of the tilted die for removing the die from the adhesive.

3. A method as recited in claim 2 comprising engaging opposite side faces of the tilted die for removing the die from the adhesive.

4. A method as recited in claim 1 comprising the preliminary step of transferring a plurality of dice from a first stretchable tape to a second non-stretchable tape, and wherein the bending step comprises bending the second tape.

5. A method for mounting light emitting diode dice on a substrate comprising the steps of:
   temporarily attaching the dice to adhesive on a flexible tape in a column extending along the tape;
   passing the tape around an edge which bends the tape and successively tilts each die relative to a successive die in the column;
   engaging a side face of a tilted die with a vacuum collet for supporting the die and removing it from the adhesive; and
   advancing the die toward the substrate by means of the vacuum collet.

6. A method as recited in claim 5 further comprising the steps of temporarily supporting the tilted die from the opposite face while being engaged by the vacuum collet, and removing the temporary support before advancing the die to the substrate.

7. A method as recited in claim 6 comprising the steps of sensing the position of each die in the space between the vacuum collet and the temporary support, and moving the tape forward or backwards as required for positioning the die in a selected location between the vacuum collet and temporary support.

8. A method as recited in claim 5 wherein the passing step comprises wrapping the tape around an edge for bending the tape through an angle of at least 150°.

9. A method as recited in claim 5 further comprising the steps of:
   mounting a semiconductor wafer on a stretchable adhesive substrate;
   sawing the wafer for separating individual light emitting diode dice;
   stretching the adhesive substrate for separating the dice from each other;
   transferring the dice to adhesive on a non-stretchable tape; and
   using the non-stretchable tape in the passing step.

10. A method as recited in claim 5 wherein the dice are arrayed on the tape in a plurality of columns perpendicular to the edge and rows parallel to the edge, and comprising the step of moving the tape and edge transverse to the vacuum collet for placing individual dice in a row in front of the vacuum collet.

11. A method as recited in claim 10 comprising the step of advancing the tape to a new row of dice after each row of dice has been placed on the substrate.

12. A method for mounting semiconductor dice on a substrate comprising the steps of:

temporarily attaching the dice to adhesive on a flexible tape in a column extending along the tape;

bending the tape around an edge adjacent to a location on a substrate where a die is to be placed, for successively bringing each die to the bent edge of the tape;

removing a die from the adhesive adjacent to the bent edge of the tape; and advancing the removed die beyond the bent edge of the tape and toward the substrate.

13. A method as recited in claim 12 comprising engaging a face of the die with a vacuum collet for removing the die from the adhesive and advancing the die toward the substrate.

14. A method as recited in claim 13 comprising engaging the opposite side face of the die with a temporary support for removing the die from the adhesive.

15. A method as recited in claim 12 wherein the passing step comprises wrapping the tape around an edge for bending the tape through an angle of at least 150°.

16. A method as recited in claim 12 comprising placing the die on the substrate with the face of the die previously adhered to the adhesive being on the substrate.

17. A method as recited in claim 12 wherein each die comprises a light emitting diode having a light emitting junction parallel to the adhesive on the tape, and comprising placing the die on the substrate with the light emitting junction parallel to the substrate.

18. A method as recited in claim 12 wherein each die comprises a light emitting diode having a light emitting junction parallel to the adhesive on the tape, and comprising:

removing the die from the adhesive after the die has moved past the edge and tilted relative to the substrate, and placing the die on the substrate with the light emitting junction perpendicular to the substrate.

19. A method as recited in claim 12 wherein the dice are arrayed on the tape in a plurality of columns perpendicular to the edge and rows parallel to the edge, and comprising the step of moving the tape and edge transverse to the vacuum collet for placing individual dice in a row in front of the vacuum collet.

20. A method as recited in claim 12 comprising the steps of:

advancing the tape so that the face of a die adjacent to the adhesive engages a temporary support beyond the edge;

engaging the opposite face of the die with a vacuum collet for removing the die from the tape;

retracting the temporary support; and advancing the die toward the substrate with the vacuum collet.

* * * * *